United States Patent
Muñoz et al.

(10) Patent No.: US 7,372,907 B2
(45) Date of Patent: May 13, 2008

(54) EFFICIENT AND FLEXIBLE OVERSAMPLED FILTERBANK WITH NEAR PERFECT RECONSTRUCTION CONSTRAINT

(75) Inventors: Michael Steven Muñoz, Redondo Beach, CA (US); Cyrus Asfandiar Dhalla, Redondo Beach, CA (US); Zoltan Zvi Stroll, Rancho Palos Verdes, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 921 days.

(21) Appl. No.: 10/458,389

(22) Filed: Jun. 9, 2003

(65) Prior Publication Data

US 2004/0246994 A1 Dec. 9, 2004

(51) Int. Cl.
*H04L 27/28* (2006.01)
(52) U.S. Cl. .................... 375/260; 370/210
(58) Field of Classification Search ........ 375/259–260, 375/285, 295, 316, 349–350; 370/343, 480, 370/481, 485, 488
See application file for complete search history.

(56) References Cited

U.S. PATENT DOCUMENTS

| | | | |
|---|---|---|---|
| 4,067,011 A | 1/1978 | Althaus | |
| 5,535,240 A | 7/1996 | Carney et al. | |
| 5,732,189 A | 3/1998 | Johnston et al. | |
| 5,754,942 A | 5/1998 | Wachs | |
| 6,049,707 A * | 4/2000 | Buer et al. | 455/314 |
| 6,173,011 B1 | 1/2001 | Rey et al. | |
| 6,236,731 B1 | 5/2001 | Brennan et al. | |
| 6,452,982 B1 * | 9/2002 | O'Dell et al. | 375/316 |
| 6,947,509 B1 * | 9/2005 | Wong | 375/350 |
| 7,145,972 B2 * | 12/2006 | Kumar et al. | 375/349 |

FOREIGN PATENT DOCUMENTS

| WO | WO 01/41320 A | 6/2001 |
|---|---|---|
| WO | WO 02/080362 A | 10/2002 |

OTHER PUBLICATIONS

Stasinski, R., "Efficient Implementation of Uniform Filter Bank in the Absence of Critical Sampling," Electronic Letters, vol. 30, No. 2, Jan. 20, 1994.

(Continued)

*Primary Examiner*—Khanh C. Tran
(74) *Attorney, Agent, or Firm*—Tarolli, Sundheim, Covell & Tummino LLP (57) ABSTRACT

A filterbank system is provided for reordering subbands of a wideband digital signal. The filterbank system extracts the subbands from a wideband digital input signal into an even channel number group of even channel number subbands and an odd channel number group of odd channel number subbands. The separation of even and odd channel number subbands provides an even channel grouping with guard bands between the even channel number subbands and an odd channel number grouping with guard bands between the odd channel number subbands. The filterbank system then reorders the even channel number subbands and the odd channel number subbands. The reordered subbands are then combined by combining the reordered even channel number subbands and odd channel number subbands into a wideband digital output signal.

29 Claims, 5 Drawing Sheets

OTHER PUBLICATIONS

Cvetkovic, Z.; Vetterli, M., "Oversampled Filter Banks", IEEE Trans. Signal Processing, vol. 46 No. 5, May 1998.

Weiss, S., Stewart, R.W., "Fast Implementation of Oversampled Modulated Filter Banks," Electronics Letters, vol. 36, No. 17, Aug. 2000.

Crochiere R E et al.: "Multirate Techniques in Filter Banks and Spectrum Analyzers and Synthesizers" Multirate Digital Signal Processing, 1983, pp. 280-400, XP002031492 p. 303-313; figures 7.11, 7.12.

Harteneck M et al.: "Design of Near Perfect Reconstruction Oversampled Filter Banks for Subband Adaptive Filters" IEEE Transactions on Circuits and Systems II: Analog and Digital Signal Processing, IEEE Inc. New York US, vol. 46, No. 8, Aug. 1999, pp. 1081-1085, XP000923773, ISSN: 1057-7130, abstract p. 1081, left-hand column.-p. 1083, left-hand column; figures 1-3.

S. Weiss; L. Lampe; R.W. Stewart: "Efficient Subband Adaptive Filtering with Oversampled GDFT Filter Banks" Dig. IEE Colloquium on Adaptive Signal Processing for Mobile Communication Systems, No. 383, Oct. 29, 1997, pp. 4/1-4/9, XP006506797 London, UK p. 4.1-4.6; figures 2-4.

European Search Report for corresponding EP 03 25 6963 Completed Nov. 21, 2005.

* cited by examiner

EFFICIENT AND FLEXIBLE OVERSAMPLED FILTERBANK WITH NEAR PERFECT RECONSTRUCTION CONSTRAINT

TECHNICAL FIELD

The present invention relates generally to communication systems, and more particularly to a near perfect reconstruction filterbank architecture for recombining a plurality of subbands into a wideband signal.

BACKGROUND OF THE INVENTION

Filterbanks have been employed in many applications such as transmultiplexers, audio/image compression, and adaptive filtering. A typical perfect reconstruction filterbank is designed to filter a wide band signal comprised of a plurality of subbands or subchannels into the subbands or subchannels, process the subbands or subchannels (e.g., compress/decompress), and then recombine the subbands or subchannels into a wide band signal with an attempt to minimize distortion. Oversampled filterbanks are widely employed to reduce the computational complexity of signal processing algorithms, such as subband adaptive filtering techniques utilized in many audio/image compression techniques. After the signal channeling and signal combining algorithms are performed, the wideband signal is typically transmitted over a radio frequency (RF) wireless link to one or more other radio devices (e.g., user terminals). The transmission frequency of the RF wireless link is at a substantially higher frequency than the processing frequency of the wideband signal.

In certain situations it is desirable to reorder the subchannels or introduce subchannels from one or more independent filterbanks. For example, in satellite transmissions the transmission frequencies (e.g., downlink frequencies) are different than the receiving frequencies (e.g., uplink frequencies). Therefore, signals that are received from ground stations with subchannels over certain frequency bands are retransmitted to user terminals over different frequency bands. Additionally, in certain applications is desirable to reorder the subchannels based on transmission order which requires the channels to be reordered not only into different frequency bands but into different frequency locations. These requirements cannot be met with conventional modulated filterbanks due to aliasing distortion of the signal caused by recombining the signal into a wideband signal.

Conventional oversampled modulated filterbanks employ "aliasing cancellation" methods to remove the aliasing distortion. This works quite well as long as the subchannels are not reordered. When the subchannels are reordered, "aliasing cancellation" cannot be utilized. Furthermore, algorithms that employ alias cancellation, when combined with subchannel switching, exhibit amplitude and group delay distortion. The distortion results because, during signal re-synthesis, the adjacent subchannels can be from different sources and do not necessarily contain the information needed for aliasing cancellation.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor delineate the scope of the invention. Its sole purpose is to present some concepts of the invention in a simplified form as a prelude to the more detailed description that is presented later.

The present invention relates to a filterbank system for reordering subbands of a wideband digital signal. The filterbank system oversamples (e.g., by downsampling by less than the number of channels) and extracts the subbands from a wideband digital input signal into an even channel number group of even channel number subbands and an odd channel number group of odd channel number subbands. The separation of even and odd channel number subbands provides an even channel grouping with guard bands between the even channel number subbands and an odd channel number grouping with guard bands between the odd channel number subbands. The filterbank system then reorders the even channel number subbands and the odd channel number subbands. The reordered subbands are then combined by combining the reordered even channel number subbands and odd channel number subbands into a wideband digital output signal.

In one aspect of the present invention, the filterbank system is a near perfect reconstruction filterbank (NPRFB). The NPRFB includes an analysis filterbank portion with an even channelizer and an odd channelizer. The even channelizer and the odd channelizer downsample the wideband digital input signal to respective channel filter functions associated with respective even and odd channel number subbands. The even channelizer includes an Inverse Discrete Fourier Transform (IDFT) component that cooperates with the even channel filter functions to produce a group of even channel number oversampled subbands separated by guard bands. Alternatively, the IDFT can be replaced with a conjugate, DFT component conjugate combination. The odd channelizer includes an IDFT component that cooperates with the odd channel filter functions to produce a group of even channel number oversample subbands separated by a guard band. The NPRFB includes a switch bank operative to reorder the subbands and synthesis portion operative to recombine the reordered subbands into a wideband digital output signal.

The synthesis filterbank portion includes an even combiner and an odd combiner. The even combiner recombines the new or reordered even channel number subbands by moving the even channel number subbands about their respective frequencies. The odd combiner recombines the new or reordered odd channel number subbands by moving the odd channel number subbands about their respective frequencies. The even combiner includes a Discrete Fourier Transform (DFT) component that cooperates with even channel filter functions to produce a group of reordered even channel number subbands, and the odd combiner includes a DFT component that cooperates with odd channel filter function to produce a group of reordered odd channel number subbands. The even channel number subbands and the odd channel number subbands are combined to provide a wideband digital output signal.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF INVENTION

The present invention relates to a filterbank architecture that minimizes distortion yet allows subchannels to be switched efficiently. The filterbank architecture employs a near perfect reconstruction filterbank (NPRFB) where the subchannels can be reordered or combined with subchannels from other independent sources without alias distortion. The present invention does not suffer from the amplitude and group delay distortion of conventional information switching or routing devices.

Figure 1:
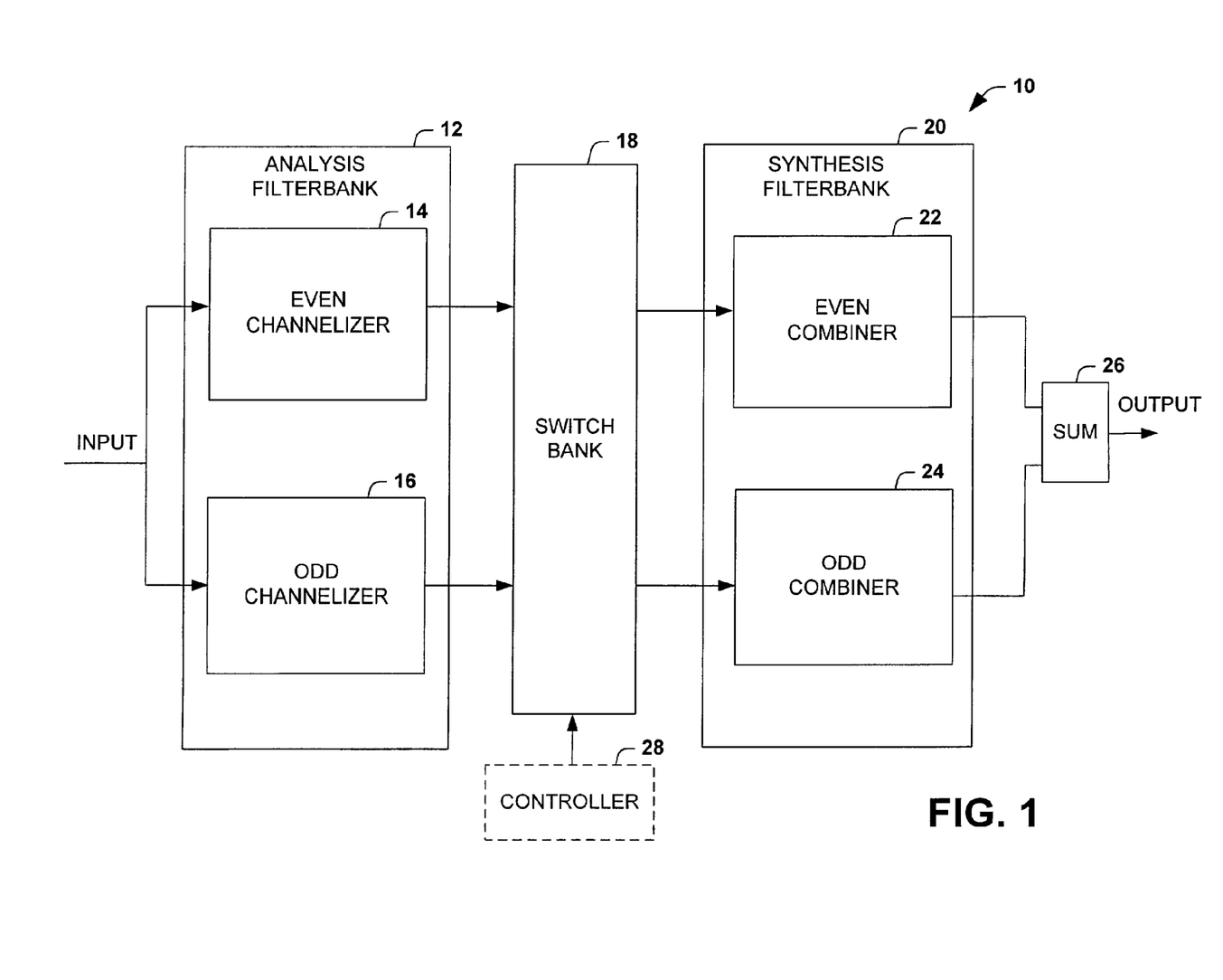
FIG. 1 illustrates a block diagram of a filterbank system in accordance with an aspect of the present invention.

FIG. 1 illustrates a block diagram of a filterbank system 10 in accordance with an aspect of the present invention. The filterbank system 10 includes an analysis filterbank portion 12, a switch bank 18 and a synthesis filterbank portion 20. The analysis filterbank portion 12 receives a wideband digital input signal (e.g., complex signal) comprised of a plurality of subbands or subchannels over a particular frequency band having a particular channel order. The analysis filterbank portion 12 includes an even channelizer 14 and an odd channelizer 16.

The even channelizer 14 extracts the even channel number subbands and moves each even channel number subband to be centered about complex baseband (e.g., zero frequency). The even channelizer 14 provides an output of the even channel number subbands that are oversampled and separated by a guard band. Additionally, the even channel channelizer 14 downsamples the wideband digital signal by a downsampling factor of N/2, where N is the number of subbands in the wideband digital signal. The downsampling of the wideband digital signal by less than N effectively provides an oversampled subband signal. The downsampling factor optimizes the oversampling of the subband signals.

The odd channelizer 16 extracts the odd channel number subbands from the wideband digital input signal and moves each odd channel number subband to be centered about complex baseband. The odd channelizer 16 provides an output of the odd channel number subbands that are oversampled and separated by a guard band. The odd channel number subbands are also frequency shifted, so that the odd channel number subbands align with the even channel number subbands. Additionally, the odd channel channelizer 16 can downsample the wideband digital signal by a downsampling factor of N/2, where N is the number of subbands in the wideband digital signal. Again, downsampling by a factor less than N effectively provides oversampled subband signals. The downsampling factor optimizes the oversampling of the subband signals. The centering of the subbands about complex baseband allows the switching and passing through of subbands to the synthesis filterbank portion 20 for reconstruction without alias distortion. Furthermore, the separating of the odd and even channels, and oversampling provides guard bands between the subbands, so that the odd and even channels can be readily switched and recombined without alias distortion.

The even channel subbands from the even channelizer 14 and the odd channel subbands from the even channelizer 16 are provided to the switch bank 18. Optionally, the switch bank 18 can be coupled to a controller 28 for performing one or more algorithms that can reorder the odd and even subbands, provide additional subbands and/or replace certain subbands. It is to be appreciated that the controller 28 can be a digital signal processor (DSP) or a plurality of DSPs. Alternatively, the switch bank 18 can include the necessary functionality for storing, reordering and switching of subbands for reconstruction into a wideband digital output signal (e.g., complex signal).

The new or reordered even channel number subbands are then provided to an even combiner 22 of the synthesis filterbank 20, while the new or reordered odd channel number subbands are provided to an odd combiner 24. The even combiner 22 and the odd combiner 24 recombine the odd and even subbands into a wideband digital signal via a summer 26. It is to be appreciated that the even channelizer 14, the odd channelizer 16, the even combiner 22, and the odd combiner 24 can employ hardware and/or software to separate and combine the plurality of subbands. Alternatively, the even channelizer 14, the odd channelizer 16, the even combiner 22, and the odd combiner 24 can employ one or more DSPs executing one or more algorithms to separate and combine the plurality of subbands or subchannels.

Some applications that are enabled by the present invention include switching subchannels between filterbanks with different sources, frequency translation of subchannels or groups of subchannels within a single filterbank, and efficient fractional oversampled filterbanks (e.g., oversampled by 3/2). Another application enabled by the present invention is to provide efficient Non-uniform filterbanks (i.e., subchannels are oversampled at the rate required by the largest filter bandwidth, and smaller sub-channels are combined to achieve the various bandwidths).

Figure 2:
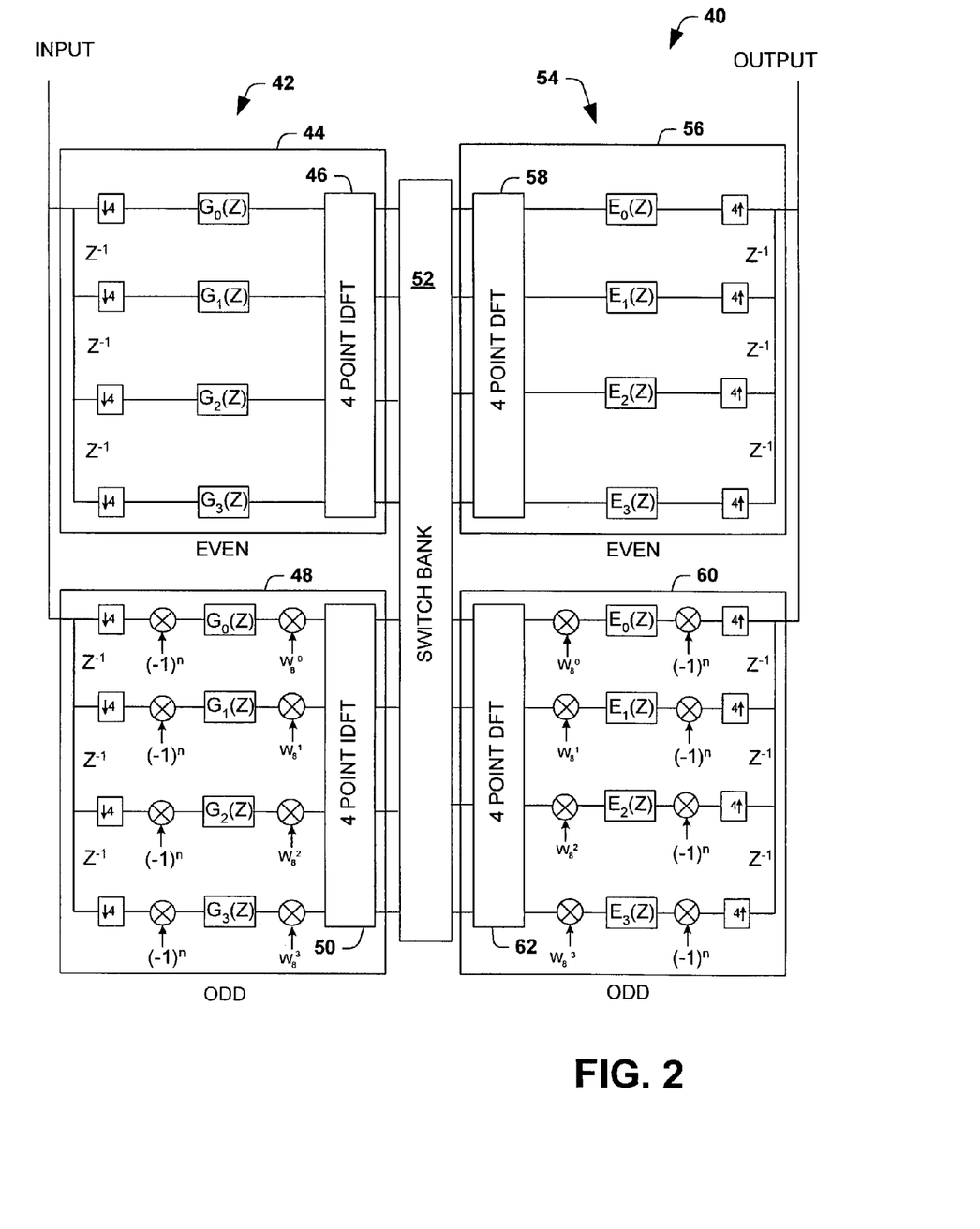
FIG. 2 illustrates a block diagram of an eight subchannel implementation of a near perfect reconstruction filterbank (NPRFB) in accordance with an aspect of the present invention.

FIG. 2 illustrates a block diagram of an eight subchannel implementation of a near perfect reconstruction filterbank (NPRFB) 40 in accordance of the present invention. It is to be appreciated that the present invention can be extended to any number of subchannels. The NPRFB 40 is comprised of an analysis filterbank 42 and a synthesis filterbank 54. The analysis filterbank 42 subdivides the incoming digital input signal or spectrum into subchannels (i.e., frequency bands) and the synthesis filterbank 54 combines the subchannels into a single wideband digital output.

In the analysis filterbank 42 of FIG. 2, the digital input signal is split into odd and even subchannel groupings employing an even channelizer filterbank 44 and an odd channelizer filterbank 48. The digital input signal is filtered into eight subchannels, four from the even channelizer filterbank 42 and four from the odd channelizer filterbank 48. The odd/even processing and the oversampling of the output of each filterbank produces a guard band between the adjacent subchannels, which is not present in conventional reconstruction filterbanks. The guard band mitigates the alias distortion during recombination. A switchbank 52 reorders the subchannels for frequency translation or to switch in or out and from or to other physically independent filterbanks. The synthesis filterbank 54 is the mirror image of the analysis filterbank 42 and performs an inverse function. For example, the analysis filterbank 42 performs a filter function G(Z) and an IFFT on the subbands, while the synthesis filterbank 54 performs a FFT and a filter function E(Z) on the reordered subbands.

Each channel of the even channelizer filterbank 44 and the odd channelizer filterbank 48 downsamples the incoming signal by N/2, where N is equal to the number of subbands of the wideband input signal. In the present example, the signal is downsampled by four which provides a data rate that is ¼ the data rate and ⅛ of the frequency content of the wideband input signal at each filter function. A conventional device would decimate the input signal by ⅛ the data rate and ⅛ the frequency content for efficient processing. However, the problem with the signal being at ⅛ data rate is that the subband input signals would have transitions bands that would alias back into the wideband output signal. Additionally, the downsampling optimizes the oversampling of the subbands at the output of the even channelizer 44.

Figure 3:
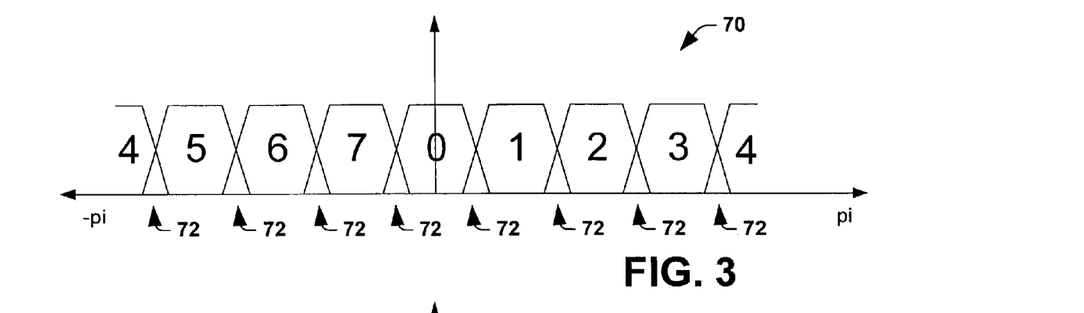
FIG. 3 illustrates a graph of output amplitude versus frequency of eight subchannels of a wideband digital signal with overlapping transitions bands.

FIG. 3 illustrates a graph 70 of output amplitude versus frequency of eight subchannels of a wideband digital signal with overlapping transitions bands. The output subbands have a frequency content range from –pi to pi, where pi is the sampled output rate at the Nyquist frequency. The overlapping transition bands 72 cause alias distortion of the signal during synthesis of the subbands into a single wideband digital output signal. The present invention reduces the downsampling of the signal to mitigate alias distortion of the subband signals upon recombining or synthesis of the subbands into a single wideband digital signal and to optimize the oversampling of the subbands at the output of the analysis filterbank 42. Although this is a tradeoff in processing efficiency, the data rate reduction in combination with separate odd/even channel processing assures sufficient guard band to eliminate alias distortion during channel recombination without substantial processing efficiency loss.

Referring again to FIG. 2, the downsampled signals of the even channelizer 42 are then provided to a corresponding channel polyphase filter unit $G_0$ (Z), $G_1$ (Z), $G_2$ (Z), $G_3$ (Z) for polyphase decomposition of the time domain response to that filter of the downsampled wideband digital signal. The decimated downsampled subband signals are then provided to a four point IDFT component 46. Alternatively, the IDFT component 46 can be replaced with a conjugate, DFT component conjugate combination. The four point IDFT component 46 cooperates with the channel polyphase filter units $G_0$ (Z), $G_1$ (Z), $G_2$ (Z), $G_3$ (Z) to center the subbands of the even channels at complex baseband (e.g., zero frequency). The centering of the subbands at complex baseband allows switching and pass through of the switched subbands to the synthesis filterbank 54. The outputs of the IDFT component 46 are then provided to the switch bank 52.

Figure 4:
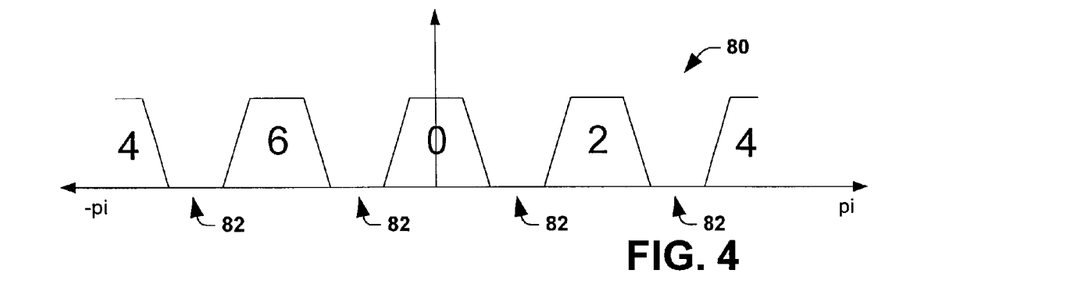
FIG. 4 illustrates a graph of output amplitude versus frequency of the even channels centered about complex baseband at the output of the even channelizer in accordance with an aspect of the present invention.

FIG. 4 illustrates a graph 80 of output amplitude versus frequency of the even numbered channels centered about complex baseband. The even channel number subbands have a frequency content range from –pi to pi, where pi is the sampled output rate at the Nyquist frequency. As illustrated in the graph 80, the zero channel is centered about complex baseband, the second channel and the sixth channel are centered an equidistant from complex baseband with the second channel in a positive frequency region and the sixth channel in a negative frequency region. The fourth channel is split between opposing ends of the baseband in both the positive and negative frequency region. Each of the even channels are separated by a guard band 82, which is due to the removal of the odd channels by the even channelizer 44 during processing in addition to the downsampling of the wideband digital input signal. The guard bands 82 facilitate reordering since the overlapping transition bands 72 have been removed.

The odd channelizer 48 also downsamples the wideband digital signal and provides the downsampled wideband digital signal to a corresponding channel polyphase filter unit $G_0$ (Z), $G_1$ (Z), $G_2$ (Z), $G_3$ (Z) for polyphase decomposition of the time domain response to that filter of the downsampled wideband digital signal. The oversampled subband signals are mixed with $(-1)^N$ multipliers where N is equal to the channel order number and an associated weight factor multiplier $W_8^0$, $W_8^1$, $W_8^2$ and $W_8^3$ to shift the odd channels to be centered about baseband.

Figure 5:
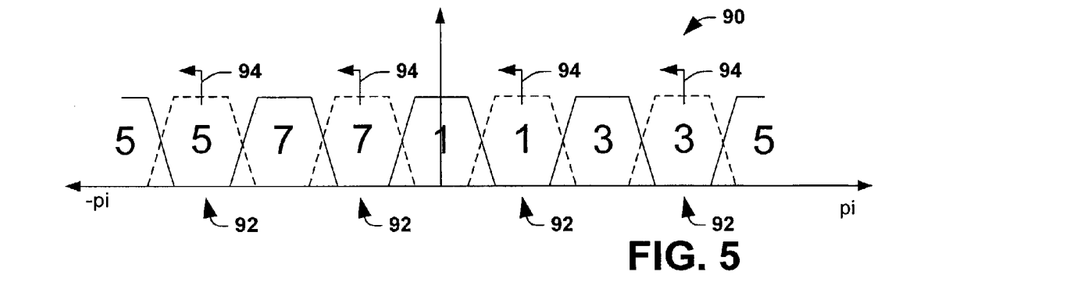
FIG. 5 illustrates a graph of output amplitude versus frequency of the odd channels centered about complex baseband at the output of the even channelizer with and without frequency shifting in accordance with an aspect of the present invention.

The decimated downsampled and shifted subband signals are then provided to an IDFT component 50. Alternatively, the IDFT component 50 can be replaced with a conjugate, DFT component conjugate combination. The IDFT component 50 cooperates with the associated channel filter unit $G_0$ (Z), $G_1$ (Z), $G_2$ (Z), $G_3$ (Z) and multipliers to center the subbands of the odd channels at complex baseband (e.g., zero frequency). FIG. 5 illustrates a graph 90 of output amplitude versus frequency of the odd channels centered about complex baseband with and without shifting the frequency. The odd channel number subbands have a frequency content range from –pi to pi, where pi is the sampled output range at the Nyquist frequency. The odd channels without frequency shifting are illustrated with dashed lines, while the frequency shifting causes the odd channels to move along arrows 94 to be aligned with the even channels. As illustrated in the graph 90, the odd channels after shifting include the first channel centered about complex baseband, the third channel and seventh channel centered an equidistant from complex baseband with the third channel in a positive frequency region and the seventh channel in a negative frequency region. The fifth channel is split between opposing ends of the baseband in both the positive and negative frequency region.

Each of the odd channels are separated by a guard band 92, which is due to the removal of the odd channels by the odd channelizer 48 during processing, in addition to the downsampling of the wideband digital signal. The guard band 92 facilitates reordering since the overlapping transition bands have been removed. The shifting of the frequency allows the odd channels to be centered about baseband, and aligned with the even channels, so that the channels can be readily reordered without alias distortion. The outputs of the IDFT component 50 are then provided to the switch bank 52.

The switch bank 52 can include capabilities for processing, channel reordering for frequency translation, or for switching in or out from or to other physically independent filterbanks. The switch bank 52 can be preprogrammed or programmable. Alternatively, the switch bank 52 can be controlled by one or more other devices. Once the subbands are processed and/or reordered, the switch bank 52 provides the subband signals to the new channel locations. The subband signals allocated for even channel locations are provided to an even channel combiner 56 of the synthesis filterbank 54 and the subband signals allocated for odd channel locations are provided to the odd channel combiner 60 of the synthesis filterbank 54. The even channel combiner 56 of the synthesis filterbank 54 includes a four point Discrete Fourier Transform (DFT) component 58 and associated filter functions $E_0(Z)$, $E_1(Z)$, $E_2(Z)$, $E_3(Z)$ for polyphase composition of the frequency domain response to that filter function. The odd channel combiner 60 of the synthesis filterbank 54 includes a four point Discrete Fourier Transform (DFT) component 62 and associated filter functions $E_0(Z)$, $E_1(Z)$, $E_2(Z)$, $E_3(Z)$ for polyphase composition of the frequency domain response to that filter function.

Figure 6:
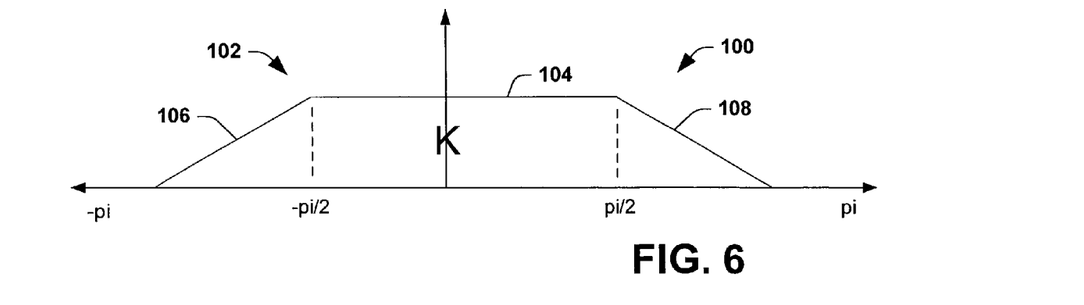
FIG. 6 illustrates a graph of output amplitude versus frequency of the recombined wideband output signal without alias distortion in accordance with an aspect of the present invention.

The odd channel combiner 60 also includes multipliers $(-1)^N$ and associated weight factor multipliers $W_8^0$, $W_8^1$, $W_8^2$ and $W_8^3$ to provide the desired frequency of the odd channels centered about their associated bands. The odd and even subband signals are then upsampled by four and combined to produce a wideband output signal at the original data rate and frequency content of the wideband input signal. FIG. 6 illustrates a graph 100 of output amplitude versus frequency of a wideband output signal 102 without alias distortion as illustrated by the flat top region 104 of the output signal. The wide output signal 102 has a frequency content that is less than the frequency content range from –pi to pi, where pi is the sampled output range at the Nyquist frequency. The flat top region 104 extend from –pi/2 to pi/2 and has transition bands 106 and 108 that move to zero before reaching the Nyquist frequency (–pi, pi). Therefore, there is no alias distortion of the wideband output signal 102.

Figure 7:
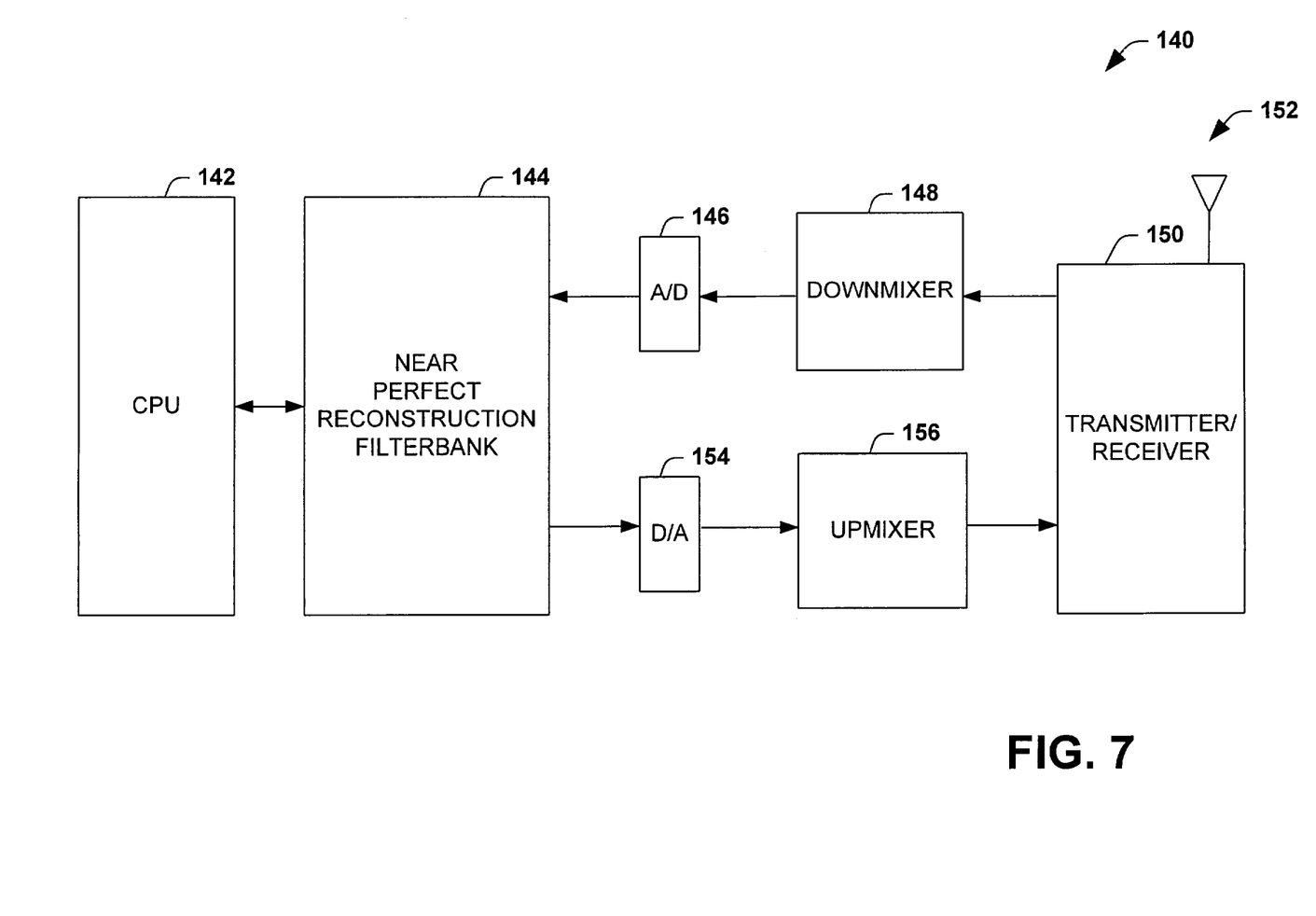
FIG. 7 illustrates a block diagram of a digital transponder that employs a near perfect reconstruction filterbank in accordance with an aspect of the present invention.

FIG. 7 illustrates a digital transponder 140 that employs a near perfect reconstruction filterbank (NPRFB) 144 in accordance with an aspect of the present invention. The digital transponder 140 can be, for example, part of a satellite or terrestrial base station device. The digital transponder 140 includes a transmitter/receiver component 150 having an antenna 152 for receiving and transmitting RF transmission signals. The transmitter/receiver component 150 receives wideband RF transmission signals and provides the wideband RF transmission signals to a downmixer 148. The downmixer 148 provides the wideband downmixed signal to an analog-to-digital (ADC) converter 146. The ADC 146 converts the wideband downmixed signal to a wideband digital signal for processing by the NPRFB 144.

The NPRFB 144 subdivides the wideband signal into a plurality of odd and even subbands with associated guard bands, as illustrated in FIGS. 1-2. The odd and even subbands can be resorted or reordered and recombined for transmission by the digital transponder 140. Alternatively, the odd and even subbands can be stored for reordering and combining with subbands from other wideband digital signals. The recombined signal is then provided to a digital-to-analog converter (DAC) 154, which converts the recombined digital signal to a wideband analog signal. The wideband analog signal is then upmixed with an upmixer 156 to provide an analog signal at a RF transmission frequency. The transmitter/receiver 150 then transmits the wideband analog signal through the antenna 152.

The NPRFB 144 includes an analysis portion that filters the digital wideband signal into a number of subbands. The subbands are then provided to a central processor unit 142. The central processor unit 142 can process the subbands, resort the subbands based on a transmission order or protocol and provide the resorted or reordered subbands back to the NPRFB 144. The NPRFB 144 includes a synthesis portion that recombines the subbands to provide a wideband digital signal centered at baseband. Alternatively, the intelligence for controlling the resorting order can be provided as part of the NPRFB 144 and the central processor unit 142 can be operative to program the NPRFB 144 and/or perform other functions associated with the digital transponder 140.

In one aspect of the present invention, the digital transponder 140 is operative to receive wideband signals from a plurality of different locations, break the wideband signals into subbands, resort or reorder the subbands with subbands from the wideband signal and/or other wideband signals, combine the reordered subbands into wideband signals, and transmit the wideband signals to one or more locations. For example, a first wideband signal can be received from a first location and a second wideband signal received from a second location. A first portion of the first wideband signal and the second wideband signal are destined for a third location, while a second portion of the first wideband signal and the second wideband signal are destined for a fourth location. The NPRFB 144 recombines the first portions of the first wideband signal and the second wideband signal, which is then transmitted to the third location. The NPRFB 144 also recombines the second portions of the first wideband signal and the second wideband signal, which is then transmitted to the fourth location. The NPRFB 144 can be preprogrammed, for example, via a preprogrammed read only memory (ROM) device, or programmed via the central processing unit 142.

Figure 8:
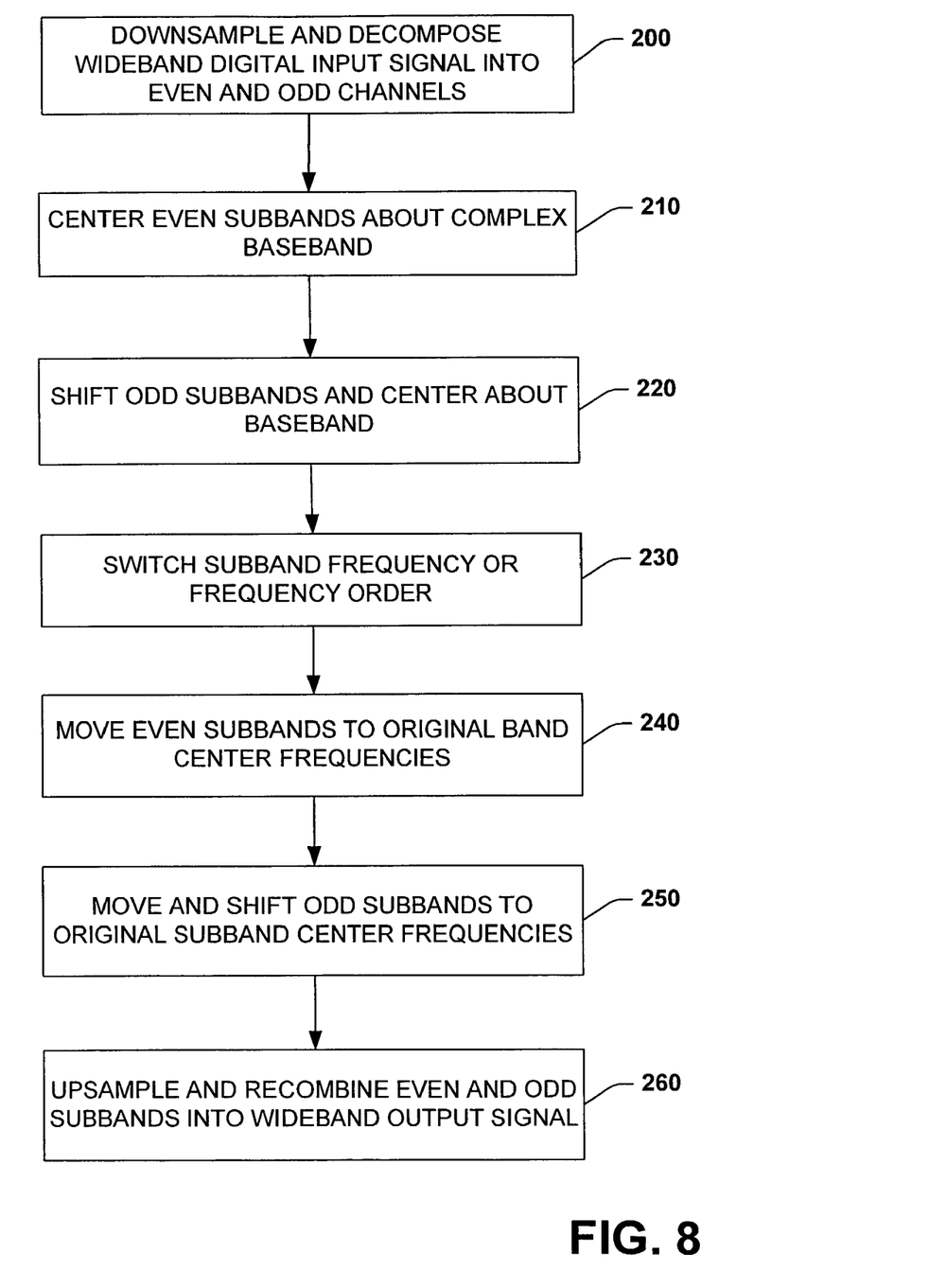
FIG. 8 illustrates a methodology for reordering subbands in a wideband digital signal in accordance with an aspect of the present invention.

In view of the foregoing structural and functional features described above, a methodology in accordance with various aspects of the present invention will be better appreciated with reference to FIG. 8. While, for purposes of simplicity of explanation, the methodology of FIG. 8 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 8 illustrates a methodology for reordering subbands in a wideband digital signal in accordance with an aspect of the present invention. The methodology begins at 200 where the wideband digital input signal is downsampled and decomposed into a plurality of even and odd channels. The wideband digital input signal can be downsampled by N/2, where N is the number of subbands of the complex wideband signal. At 210, the even subbands are centered about a complex baseband frequency (e.g., zero frequency). The even subbands can be centered about complex baseband by separating the subbands utilizing polyphase filter function in cooperation with an IDFT component. The combination of the downsampling by N/2, the polyphase filter function and the IDFT component on the even subbands provides a set of subband signals that are oversampled, and separated by a guard band. At 220, the odd subbands are frequency shifted and centered about complex baseband frequency. The odd subbands can be centered about complex baseband by separating the subbands utilizing polyphase filter functions in cooperation with an IDFT component. The combination of the downsampling by N/2, the polyphase filter function and the IDFT component on the odd subbands provides a set of subband signals that are oversampled, centered about baseband and separated by a guard band. The odd subbands are frequency shifted to align the odd subbands with the even subbands. The methodology then proceeds to 230.

At 230, the subband frequency or subband channel order is switched or modified, for example, based on a predetermined protocol. The subbands switched to the even channels are then moved to their respective center frequency at 240. The even channel subbands can be moved to their respective center frequency utilizing a DFT in cooperation with a polyphase filter function to position the even channels, as illustrated in FIG. 4. At 250, the subbands switched to the odd channels are frequency shifted and moved to their respective center frequencies. The odd channel subbands can be moved to their respective frequency utilizing a DFT in cooperation with a polyphase filter function. The odd channel subbands can be frequency shifted employing multipliers to shift the odd channel frequency to their respective center frequency, as illustrated in FIG. 5. At 260, the even and odd channel subbands are upsampled and recombined to provide a wideband output signal (e.g., complex signal).

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A filterbank system comprising:
    an analysis filterbank that receives a wideband digital input signal comprised of a plurality of subbands, oversamples and extracts the subbands into an even channel number grouping of even channel number subbands separated by guard bands and an odd channel number grouping of odd channel number subbands separated by guard bands;
    a switch bank operative to reorder the even channel number subbands and the odd channel number subbands; and
    a synthesis filterbank that combines the reordered even and odd channel number subbands into a wideband digital output signal.

2. The system of claim 1, the even channel number subbands and the odd channel number subbands being oversampled by downsampling to facilitate the generation of the guard bands.

3. The system of claim 2, the wideband digital input signal being downsampled by a downsampling factor of N/2 prior to extraction of an associated subband from the wideband digital input signal, where N is equal to the number of subbands in the wideband digital input signal.

4. The system of claim 1, the analysis filterbank being comprised of an even channelizer that oversamples and extracts the even channel number subbands and an odd channelizer that oversamples and extracts the odd channel number subbands.

5. The system of claim 4, the even channelizer comprising even channel filter functions associated with a respective even channel number subband and an Inverse Discrete Fourier Transform (IDFT) component that cooperates with the even channel filter functions to generate the even channel number subbands being centered about complex baseband.

6. The system of claim 4, the even channelizer comprising even channel filter functions associated with a respective even channel number subband and a combination of a first conjugate, a Discrete Fourier Transform (DFT) and a second conjugate that cooperate with the even channel filter functions to generate the even channel number subbands being centered about complex baseband.

7. The system of claim 4, the odd channelizer having odd channel filter functions associated with a respective odd channel number subband and an IDFT component that cooperates with the odd channel filter functions to generate the odd channel number subbands being centered about complex baseband.

8. The system of claim 4, the odd channelizer having odd channel filter functions associated with a respective odd channel number subband and a combination of a first conjugate, a Discrete Fourier Transform (DFT) and a second conjugate that cooperate with the even channel filter functions to generate the odd channel number subbands being centered about complex baseband.

9. The system of claim 4, the odd channelizer having multipliers associated with a respective odd channel number subband to shift the frequency of the odd channel number subbands to be aligned with the even channel number subbands about complex baseband.

10. The system of claim 4, the wideband digital input signal being downsampled and delayed by a downsampling factor of N/2 at each channel of the odd channelizer and the even channelizer to effectively provide oversampling of each channel of the odd channelizer and the even channelizer, where N is equal to the number of subbands in the wideband digital input signal, the downsampled wideband digital input signal being provided to respective odd and even filter functions associated with a respective channel of the even channelizer and the odd channelizer.

11. The system of claim 1, the synthesis filterbank being comprised of an even combiner and an odd combiner, the even combiner having an even channel Discrete Fourier Transform (DFT) component and even channel filter functions associated with a respective even channel number subband, the even channel DFT component cooperates with the even channel filter function to move the even channel number subbands to be centered about their respective frequencies, the odd combiner having an odd channel DFT component, odd channel multipliers and odd channel filter functions associated with a respective odd channel number subband, the odd channel DFT component cooperates with the odd channel multipliers and odd channel filter functions to move the odd channel number subbands to be centered about their respective frequencies.

12. The system of claim 1, further comprising a controller coupled to the switch bank, the controller determines the reordering of the subbands by the switch bank.

13. The system of claim 1, the switch bank having intelligence that determines the reordering of the subbands by the switch bank.

14. A digital transponder comprising the system of claim 1.

15. A near perfect reconstruction filterbank (NPRFB) comprising:
    an even channelizer that oversamples and extracts even channel number subbands from a wideband digital input signal;
    an odd channelizer that oversamples and extracts odd channel number subbands from the wideband digital input signal;
    a switch bank operative to reorder the even channel number subbands and the odd channel number subbands; and a synthesis filterbank that combines the reordered even and odd channel number subbands into a wideband digital output signal.

16. The NPRFB of claim 15, the even channelizer employing associated downsampling components to oversample the even channel number subbands and a filter function unit associated with each of the even channel number subbands and an Inverse Discrete Fourier Transform (IDFT) component that cooperates with the filter function units and the associated downsampling components to generate a group of even channel number oversampled subbands with guard bands therebetween.

17. The NPRFB of claim 16, the downsampling components downsamples the wideband digital input signal by a downsampling factor of N/2 at each of the even channel number subbands, where N is equal to the number of subbands in the wideband digital input signal.

18. The NPRFB of claim 15, the odd channelizer comprising associated downsampling components to oversample the odd channel number subbands and a filter function unit associated with each of the odd channel number subbands and an Inverse Discrete Fourier Transform (IDFT) component that cooperates with the filter function units and the downsampling components to generate a group of odd channel number oversampled subbands with guard bands therebetween.

19. The NPRFB of claim 18, the downsampling components downsample the wideband digital input signal by a downsampling factor of N/2 at each of the odd channel number subbands, where N is equal to the number of subbands in the wideband digital input signal.

20. The NPRFB of claim 15, the synthesis filterbank being comprised of an even combiner and an odd combiner, the even combiner having an even channel Discrete Fourier Transform (DFT) component and even channel filter functions associated with a respective even channel, the even channel DFT component cooperates with the even channel filter functions to move the even channel number subbands to be centered about their respective frequencies, the odd combiner having an odd channel DFT component, odd channel multipliers and odd channel filter functions associated with a respective odd channel, the odd channel DFT component cooperates with the odd channel multipliers and odd channel filter functions to move the odd channel number subbands to be centered about their respective frequencies.

21. The NPRFB of claim 15, the switch bank being preprogrammed to reorder the subbands based on a predetermined order.

22. A system for reordering subbands of a wideband digital signal having a plurality of subbands, the system comprising:
means for oversampling and extracting subbands from a wideband digital input signal into an even channel number grouping of even channel number subbands and an odd channel number grouping of odd channel number subbands;
means for reordering the even channel number subbands and the odd channel number subbands; and
means for combining the reordered even and odd channel number subbands into a wideband digital output signal.

23. The system of claim 22, the means for oversampling and extracting subbands providing guard bands between the even channel number subbands and the odd channel number subband.

24. The system of claim 22, the means for reordering and the means for combining being operative to combine portions of different wideband digital input signals into a wideband digital output signal.

25. A method for reordering subbands of a wideband digital signal having a plurality of subbands, the method comprising:
decomposing the wideband digital signal into an even channel number grouping of even channel number subbands and an odd channel number grouping of odd channel number subbands, such that the even channel number subbands are centered about complex baseband in the even channel number grouping with guard bands therebetween, and the odd channel number subbands are centered about complex baseband in the odd channel number grouping with guard bands therebetween;
reordering the even and odd channel number subbands; and
recombining the reordered even and odd channel number subbands into a wideband digital output signal.

26. The method of claim 25, the decomposing the wideband digital signal comprising oversampling by downsampling the wideband digital signals for each even channel number subband and performing a filter function on each downsampled signal in cooperation with an even channel Inverse Discrete Fourier Transform (IDFT) to provide a group of oversampled even channel number subbands separated by guard bands, and oversampling by downsampling the wideband digital signals for each odd channel number subband and performing a filter function on each downsampled signal in cooperation with an odd channel IDFT to provide a group of oversampled odd channel number subbands separated by guard bands.

27. The method of claim 26, the downsampling comprising downsampling by a factor of N/2 at each of the even and odd channel number subbands, where N is equal to the number of subbands in the wideband digital input signal.

28. The method of claim 25, the decomposing further comprising shifting the frequency of the odd channel number subbands to be aligned with the even channel number subbands.

29. The method of claim 25, the recombining comprising performing a Discrete Fourier Transform (DFT) on the even channel number subbands and performing a filter function and an upsampling for each even channel number subband and performing a DFT on the odd channel number subbands and performing a filter function and an upsampling for each odd channel number subbands to generate the wideband digital output signal.

* * * * *